United States Patent [19]
Arai et al.

[11] Patent Number: 4,786,526
[45] Date of Patent: Nov. 22, 1988

[54] SURFACE TREATING METHOD AND APPARATUS

[75] Inventors: Tohru Arai; Junji Endo; Hiromasa Takeda, all of Aichi, Japan

[73] Assignee: Kabushiki Kaisha Toyota Chuo Kenkyusho, Japan

[21] Appl. No.: 66,483
[22] PCT Filed: Jul. 14, 1986
[86] PCT No.: PCT/JP86/00360
  § 371 Date: May 29, 1987
  § 102(e) Date: May 29, 1987
[87] PCT Pub. No.: WO87/02073
  PCT Pub. Date: Apr. 9, 1987

[30] Foreign Application Priority Data
  Oct. 3, 1985 [JP] Japan .............. 60-220925

[51] Int. Cl.$^4$ .............................. B05D 1/22
[52] U.S. Cl. .................. 427/249; 427/213;
  427/255.2; 427/255.4; 118/429; 118/717;
  118/DIG. 5
[58] Field of Search ........... 118/429, 717, DIG. 5;
  427/213, 249, 255.2, 255.4; 148/6, 6.35

[56] References Cited
U.S. PATENT DOCUMENTS 3,409,459 11/1968 Jacobson .............. 117/71
3,475,233 10/1969 Jacobson .............. 148/6.3
4,461,656 7/1984 Ross .................. 148/16.6
4,585,673 4/1986 Sigai ................. 427/255.2

FOREIGN PATENT DOCUMENTS 122529 10/1984 European Pat. Off.
2306402 2/1973 Fed. Rep. of Germany.
2181512 12/1973 France.
2306276 10/1976 France.
897559 5/1962 United Kingdom.

Primary Examiner—Shrive P. Beck
Attorney, Agent, or Firm—Berman, Aisenberg & Platt

[57] ABSTRACT

A method and apparatus for forming a layer of a carbide or nitride of, for example, titanium or vanadium on the surface of material to be treated in a fluidized bed furnace. A refractory powder for forming a fluidized bed, a vessel or vessels filed with powder of a treating agent, and the material to be treated are placed in the furnace. The treating agent includes powder of at least one carbide or nitride forming metal or alloy and powder of at least one compound selected from the group consisting of chlorides, fluorides, bromides, iodides and boro-fluorides of alkali and alkaline earth metals and/or at least one of an ammonium halide and a metal halide. A fluidizing gas is introduced into the furnace under heat to form a fluidized bed in which the surface of the material to be treated is treated. The vessel or vessels are placed in the furnace in a spaced-apart relation from the material to be treated, so that no powder of the treating agent may adhere to the surface of the material to be treated.

10 Claims, 3 Drawing Sheets

SURFACE TREATING METHOD AND APPARATUS

This application is related to U.S. Pat. No. 4,569,862 and to application Ser.No. 913,643, filed on Sept. 30, 1986 (now U.S. Pat. No. 4,686,117).

BACKGROUND OF THE INVENTION

1. Field of the Invention

This invention relates to a method of treating the surface of an iron alloy or similar material in a fluidized bed furnace to form a carbide or nitride layer thereon and an apparatus for carrying out the method.

2. Description of the Prior Art

A furnace having a bed of alumina powder into which gas, such as air or argon, is blown to fluidize it, is used as a heat medium for the heat treatment of steel. This heat medium has a uniform temperature distribution and can transfer heat quickly. Therefore, the furnace can rapidly and uniformly heat the material to be treated.

A known method employs a fluidized bed furnace to form a diffused metal carbide or nitride layer on the surface of an iron al3oy or similar material. Gas of a halide of an element for forming a carbide or nitride, hydrogen gas, and nitrogen or hydrocarbon gas are, for example, introduced into alumina powder in a furnace to form a fluidized bed. The material to be treated is placed in the fluidized bed and heated. The halide gas is decomposed on the material to form a carbide or nitride layer on its surface. This method, however, has a number of disadvantages. Separate apparatus is required for generating the halide gas. The hydrogen gas, which is used as a carrier gas, involves the danger of explosion. The furnace cannot be opened to enable removal of the material immediately after it has been treated. No rapid quenching is, therefore, possible when the material is cooled. If its hardening is required, it calls for quenching treatment.

FIG. 3 shows an apparatus which is used to carry out method developed by the inventors of this invention in order to solve the problems as hereinabove pointed out. A mixture a of the powder of a treating agent and the powder of a refractory material, such as alumina, is put in a fluidized bed furnace b. The treating agent is composed of a metallic element for forming a carbide or nitride or an alloy thereof, and a promotor, such as ammonium halide. A fluidizing gas, such as argon or nitrogen, is introduced into the furnace b through a gas supply passage c to form a fluidized bed. The material d to be treated is placed in the fluidized bed and the furnace b is heated by a heater e, whereby a carbide or nitride layer is formed on the surface of the material d. This method is safe, as it does not use any hydrogen or halogen vapor.

This method is, however, not free from any problem. If the material to be treated has a complicated shape or consists of a large number of small articles which are closely with one another in the treating agent, the powder of the treating agent, which is highly reactive with the material to be treated, is likely to adhere to the surface thereof. The adhering powder causes the seizing or wear of the material if it is, for example, a stainless steel strip forming die or an extrusion die for cold forging. Therefore, it is necessary to remove the adhering powder. When the treating agent has decreased its power of forming a carbide or nitride layer, it is necessary to change the mixed powder a as a whole.

SUMMARY OF THE INVENTION

It is an object of this invention to provide a method which can form a carbide or nitride layer on the surface of the material to be treated in a fluidized bed furnace without allowing any powder of a treating agent to adhere to the treated surface, and which makes it possible to change the treating agent easily.

This object is attained by a method comprising the step of filling a vessel made of a porous material with a treating agent, the step of placing the vessel, powder of a refractory material and the material to be treated in a fluidized bed furnace in such a way that the material to be treated may not contact the vessel, and the step of introducing a fluidizing gas into the furnace under heat to form a fluidized bed in which the surface of the material to be treated is treated, these steps being carried out in any order, the treating agent being composed of the powder of at least one carbide or nitride forming metal or alloy and powder of at least one compound selected from the group consisting of chlorides, fluorides, bromides, iodides and borofluorides of alkali and alkaline earth metals and/or at least one of an ammonium halide and a metal halide.

It is another object of this invention to provide an apparatus which can be used for carrying out the method. This object is attained by an apparatus comprising a fluidized bed furnace having an inlet for a fluidizing gas and a gas outlet, a gas distributor positioned adjacent to the gas inlet, and a vessel made of a porous material and so positioned in the furnace between the gas distributor and the gas outlet that it may not contact the material to be treated, the vessel being filled with a treating agent.

The powder of the treating agent for forming a carbide or nitride is placed in the vessel and kept from contacting the material to be treated.

Other objects, features and advantages of this invention will become apparent from the following description and the accompanying drawings.

DETAILED DESCRIPTION OF THE INVENTION

Figure 1:
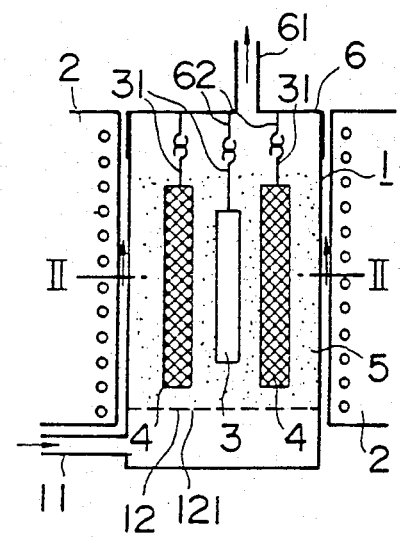
FIG. 1 is a vertical sectional view of an apparatus embodying this invention.
Figure 2:
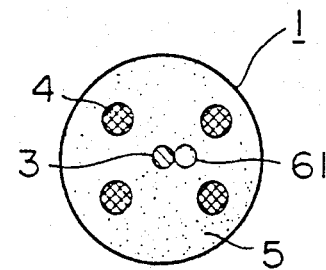
FIG. 2 is a sectional view taken along the line II—II of FIG. 1.
Figure 3:
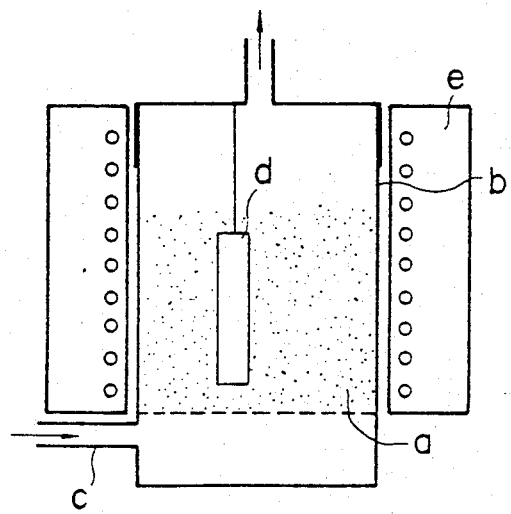
FIG. 3 is a vertical sectional view of a known apparatus.

A fluidized bed furnace is used for carrying out this invention. It may be a furnace of the type which is usually used for drying, incineration, reduction or other purposes. Referring to FIGS. 1 and 2, there is shown by way of example a furnace comprising a main body 1 provided with an inlet 11 for a fluidizing gas at its bottom. A gas distributor 12 is provided in the main body 1 adjacent to the gas inlet 11. A cover 6 having a gas outlet 61 is provided at the top of the furnace. The cover 6 may form an integral part of the main body 1 if the main body 1 is provided with a door through which a vessel for a treating agent and the material to be treated can be introduced into the furnace.

According to an important feature of this invention, the vessel which is filled with the treating agent is so positioned in the furnace as not to contact the material to be treated. The vessel is made of a porous material which is impervious to the powder of the treating agent, but pervious to the gas rising from the treating agent. It may, for example, be formed from a net of stainless steel. Therefore, the vessel prevents any powder of the treating agent from adhering to the surface of the material to be treated.

The apparatus shown in FIGS. 1 and 2 includes four vessels 4 each suspended from a hook 62 provided on the inner surface of the cover 6. This arrangement makes it easy to introduce the vessels 4 into the furnace or remove them therefrom. The material 3 to be treated is also suspended from a hook 62 in such a way that it may not contact the vessels 4. A rack may be used instead of the hooks 62 for suspending the material 3 and the vessels 4. A heater 2 is provided around the furnace body 1. The furnace body 1 is filled above the gas distributor 12 with powder 5 of a refractory material, such as alumina. A fluidizing gas is introduced into the furnace body 1 through the gas inlet 11 to fluidize the refractory powder 5 and is discharged through the gas outlet 61.

The refractory powder forming a fluidized bed must be of an inert substance which does not react with the metal or alloy of which the material to be treated is composed. It may be alunina ($Al_2O_3$), silicon oxide ($SiO_2$), titanium oxide ($TiO_2$), zirconia ($ZrO_2$) or similar material which is usually used for heat treatment purposes. The powder may be of one or more such substances. The powder preferably has a particle size of 60 to 200 mesh. This is a range which is selected for the powder used for ordinary heat treatment applications. If the powder has a particle size which is finer than 200 mesh, it is difficult to handle and fluidize uniformly. If the powder has a particle size which is coarser than 60 mesh, it undesirably requires a larger amount of fluidizing gas. The powder is placed on the gas distributor, in such a quantity as enables it to have, when fluidized, a depth which is two or three times larger than the length of the material to be treated, so that it may easily form a uniformly fluidized bed having a uniform temperature distribution and thus form a uniform layer.

The treating agent is a powder which is reactive to form a carbide or nitride layer on the surface of the material to be treated. The treating agent may be composed of powder of at least one carbide or nitride forming metal or alloy and powder of at least one compound selected from the group consisting of chlorides, fluorides, bromides, iodides and borofluorides of alkali and alkaline earth metals and/or 87/02073 at least one of an ammonium halide and a metal halide.

The metal for forming a carbide or nitride is a metal which easily combines with carbon or nitrogen to form a carbide or nitride. Typical examples are titanium (Group IVa), vanadium, niobium and tantalum (Group Va), chromium (Group VIa) and manganese (Group VIIa) Examples of the alloy are ferroalloys, such as Fe-V, Fe-Nb and FeCr. A mixture of two or more metals or alloys can be used to form a composit layer, or two or more carbide or nitride layers.

The alkali or alkaline earth metal compound and/or the halogen compound react with the carbide or nitride forming metal or alloy to produce gas of a compound of the carbide or nitride forming element. For example, if anmonium chloride ($NH_4Cl$) reacts with vanadium, they produce vanadium chloride gas which contributes to forming the carbide or nitride of vanadium.

Examples of the alkali or alkaline earth metal compounds are NaCl, KCl, $CaCl_2$ and $KBF_4$. One or more of those compounds are used. As regards the halogen compound, one or both of an ammonium halide and a metal halide are used. Examples of the ammonium halides are $NH_4Cl$, $NH_4Br$, $NH_4I$ and $NH_4F$ and examples of the metal halides are $TiF_4$, $VF_3$, $VCl_3$, $FeCl_3$ and $TiBr_4$. One or more of those compounds may be used. It is also possible to use a mixture of one or more alkali or alkaline earth metal compounds and one or more halogen compounds.

The treating agent preferably contains 0.5 to 20% by weight of the alkali or alkaline earth metal compound and/or the halogen compound, while the balance is occupied by the carbide or nitride forming metal or alloy. If the proportion of the alkali or alkaline earth metal compound and/or the halogen compound is smaller than 0.5% by weight, only a carbide or nitride layer having an undesirably small thickness is formed. If the proportion is greater than 20% by weight, an undesirably large amount of gas is produced and can cause the blocking of the gas outlet or other trouble.

It is possible to use a halide of a carbide or nitride forming element, such as $VCl_3$ or $TiF_4$, effectively under certain conditions to form a layer containing any such element. If the powder of the treating agent tends to solidify, it is effective to add thereto the powder of alumina or other refractory material which does not react with the treating agent, in that regard the treating agent may contain 5 to 80% by weight of the refractory material.

The powder of the treating agent may have a particle size of 4 to 350 mesh. If it has a particle size which is coarser than 4 mesh, it fails to react easily and generate a satisfactorily large amount of gas which contributes to forming a carbide or nitride layer. If its particle size is finer than 350 mesh, it is difficult to handle.

According to this invention, it is possible to form a carbide layer on various kinds of materials if they contain carbon. For example, it is possible to form a carbide layer on an iron, nickel, cobalt or other metallic material containing carbon, cemented carbide, or a carbonaceous material, such as graphite. The carbide forming element which the treating agent contains combines with the carbon in the material to be treated, whereby a carbide is formed on the surface of the material to be treated. It is preferable that the material to be treated have a carbon content of at least 0.2% by weight. If it has a lower carbon content, it is difficult to form a carbide layer thereon, or an undesirably long time is required for forming a carbide layer having a suitable thickness.

When it is desirable to form a nitride layer, the material to be treated need not contain carbon. It is possible to form a nitride layer on, for example, iron, nickel, cobalt and other metallic materials, cemented carbides, or nonmetallic materials, such as the sintered products of alumina and other oxides. Gas containing nitrogen is used for fluidizing purposes. The nitride forming element which the treating agent contains combines with the nitrogen in the fluidizing gas to form a nitride on the surface to be treated. A carbonitride layer is formed if the material to be treated contains carbon.

According to this invention, it is also possible to form a carbide or nitride layer on an iron alloy material which has been nitrided. The carbide layer which can be formed thereon contains nitrogen. The nitride layer can be formed without requiring any fluidizing gas containing nitrogen.

The fluidizing gas may be an inert gas, such as argon, when a carbide layer is formed, or nitrogen or other gas containing nitrogen, such as ammonium, or a mixture thereof with argon when a nitride layer is formed. The fluidizing gas can contain as small an amount of hydrogen as is within its explosion limit. The gas may be of ordinary purity.

The fluidizing gas preferably has a flow rate of 50 to 700 cm/min. in the furnace. If its flow rate is lower than 50 cm/min., it fails to fluidize the refractory powder satisfactorily and an undesirably long time of treatment is, therefore, required. If its flow rate exceeds 700 cm/min., there is every likelihood that heavy bubbling may render the treatment difficult. A flow rate of 60 to 600 cm/min. is particularly preferred to improve the fluidization of the refractory powder and facilitate the treatment. It is preferable from the standpoint of easy operation for the gas to have a pressure of 0.5 to 2 kg/cm$^2$ when entering the furnace through its gas inlet.

Figure 4:
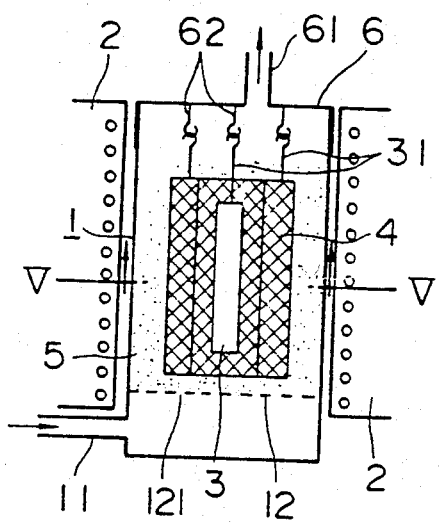
FIG. 4 is a vertical sectional view of another apparatus embodying this invention.
Figure 5:
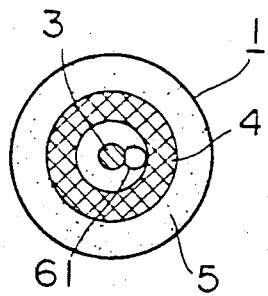
FIG. 5 is a sectional view taken along the line V—V of FIG. 4.

The vessel for holding the treating agent may have various shapes. The vessels 4 shown in FIGS. 1 and 2 are cylindrical. FIGS. 4 and 5 show a cylindrical vessel having an axial hole therethrough. A vessel or vessels having a rectangular cross-section, or a flat vessel or vessels are optionally used.

Figure 6:
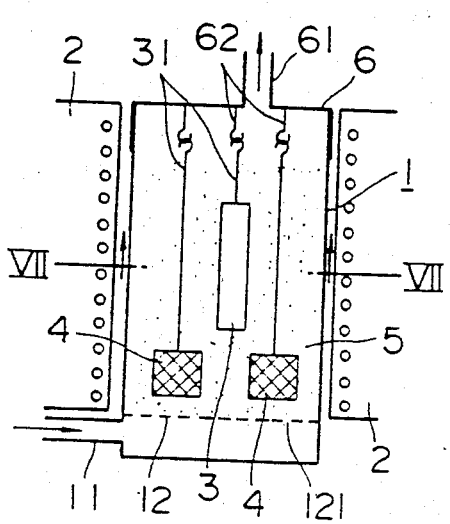
FIG. 6 is a vertical sectional view of still another apparatus enbodying this invention.
Figure 7:
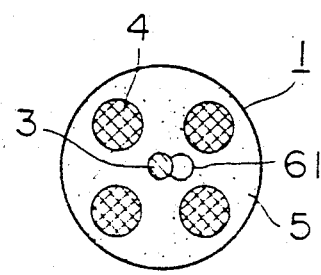
FIG. 7 is a sectional view taken along the line VII—VII of FIG. 6.

The distance between the vessel or vessels and the material to be treated and the quantity of the treating agent with which the vessel or vessels are filled are so selected as to enable a sufficiently large amount of gas to reach the surface of the material to be treated. While the distance had better be shortened to promote the formation of a carbide or nitride layer, a fluidized bed is difficult to form or maintain if it is too short. The vessel or vessels had better be positioned closer to the inlet for the fluidizing gas than the material to be treated is, as shown in FIGS. 6 and 7. This arrangement ensures that the gas rising from the treating agent in the vessel or vessels be effectively carried by the fluidizing gas and brought into contact with the surface of the material to be treated. Alternatively, it is possible to position the vessel or vessels and the material to be treated at the same level of height. In this case, however, it is important to ensure that the vessel or vessels and the material to be treated have a total cross-sectional area not exceeding one-third of the cross-sectional area of the fluidized bed; otherwise, the bed would be difficult to fluidize properly.

Referring again to FIGS. 1 and 2, the fluidizing gas is introduced into the furnace through its gas inlet 11, flows past the gas distributor 12 and fluidizes the refractory powder 5. The refractory powder 5 is blown up through the furnace and forms a fluidized bed in which it is maintained in a floating position by the pressure of the fluidizing gas which is continuously introduced. If the fluidized bed is heated, its heat causes the reaction of the treating agent in the vessels 4 to produce a gas which contributes to forming a carbide or nitride. This gas is carried to the surface of the material 3 to be treated by the fluidizing gas.

The fluidized bed is heated by the heater which is in the apparatus of FIG. 1 disposed about the furnace body 1 as shown at 2. The heater can alternatively be located within the furnace body.

The fluidized bed or the furnace is heated to a temperature of 700° C. to 1200° C. If the temperature is lower than 700° C., an undesirably long time is required for forming a carbide or nitride layer. If it is higher than 1200° C., the material to be treated is likely to be deteriorated. When an iron alloy material which has been nitrided is treated, the carbide or nitride forming element in the treating agent is diffused into the iron nitride on the iron alloy material (or iron carbonitride if the material contains carbon) to replace the iron and thereby form its own nitride (or carbonitride). This nitride (or carbonitride) can be formed at a relatively low temperature which is not lower than 400° C.

The treating time ranges from one to five hours, depending on the composition of the material to be treated and the composition and thickness of the layer to be formed. The formation of a layer having a predetermined thickness usually requires a relatively short time if a high temperature is employed, and a relatively long time if a low temperature is employed.

It is possible under certain conditions that the refractory powder may clog the apertures of the gas distributor and thereby prevent the formation of a properly fluidized bed. This trouble can be avoided if coarse particles of alumina or other refractory material having a particle size of 10 to 20 mesh are disposed between the gas distributor and the refractory powder which forms a fluidized bed.

According to this invention, the vessel or vessels filled with the treating agent, the material to be treated and the refractory powder are placed in the furnace and the fluidizing gas is, then, introduced into the furnace. This order can, however, be reversed. The fluidizing gas can be introduced into the furnace before the vessel or vessels, the material and the refractory powder are placed therein.

Figure 8:
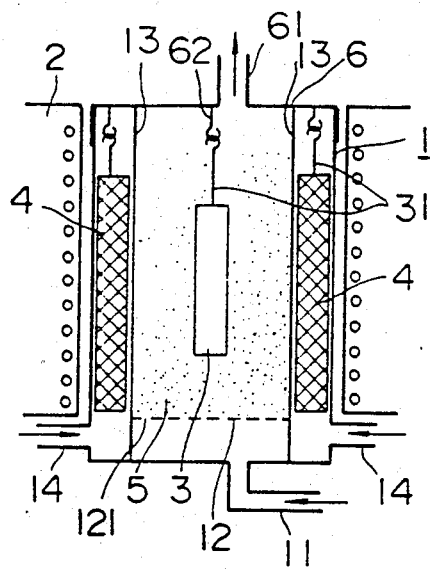
FIG. 8 is a vertical sectional view of still another apparatus embodying this invention.

Referring to FIG. 8, another fluidized bed furnace that can be used to carry out this invention has a cylindrical inner furnace body 13 disposed coaxially in a main furnace body 1. The inner surface of the main furnace body 1 and the outer surface of the inner furnace body 13 define therebetween an annular space in which vessels 4 for holding the treating agent are positioned. The furnace has a first gas inlet 11 provided at the bottom of the inner furnace body 13. A gas distributor 12 is provided in the inner furnace body 13 immediately above the gas inlet 11. The powder 5 of alumina or other refractory material for forming a fluidized bed is placed on the gas distributor 12. That part of the wall of the inner furnace body 13 which extends upward from the gas distributor 12 is made of a porous material which is pervious to gas, but is impervious to the powder of the treating agent. For example, it may be formed from a net of an appropriate material. The fluidizing gas is introduced into the inner furnace body 13 through the gas distributor in the inner furnace from the gas inlet 11 to fluidize the refractory powder 5. The furnace has a second gas inlet 14 provided at the bottom of the main furnace body 1. An inert gas, such as argon, is introduced into the vessels 4 through the gas inlet 14 to carry the gas rising from the treating agent quickly to the surface of the material to be treated. The amount of the inert gas to be introduced is preferably about one-tenth to about a half of the amount of the fluidizing gas. If too large an amount of the inert gas is supplied, the treating agent quickly loses its power of forming a carbide or nitride layer If the amount of the inert gas is too small, it fails to carry a satisfactorily large amount of gas from the treating agent to the material to be treated.

If the material to be treated is carburized or nitrided before it is treated by the method of this invention, the apparatus of this invention can be used for such carburizing or nitriding treatment, too. When such carburizing or nitriding treatment is desired, the material to be treated and the refractory powder are placed in the furnace, while the vessel or vessels for holding the treating agent are removed therefrom. A carburizing or nitriding gas is introduced into the furnace for carburizing or nitriding the material to be treated. Then, a fluidizing gas, such as argon, is introduced, while the supply of the carburizing or nitriding gas is discontinued, and the vessel or vessels filled with the treating agent are placed in the furnace, so that a carbide or nitride layer may be formed on the material to be treated. Thus, a single furnace can be used effectively for carrying out both the preliminary carburizing or nitriding treatment and the surface treatment for which this invention is primarily intended.

When a carbide layer is formed on the material to be treated, it is likely that the material which has been treated may have a softened portion formed under its carbide layer. This softened portion is due to the shortage of carbon, as carbon has been consumed to form the carbide layer. This problem can be overcome if the material is heated again so that carbon may be diffused from its inner portion to its softened portion. This heat treatment can also be carried out by using any of the fluidized bed furnaces as hereinabove described.

Figure 10:
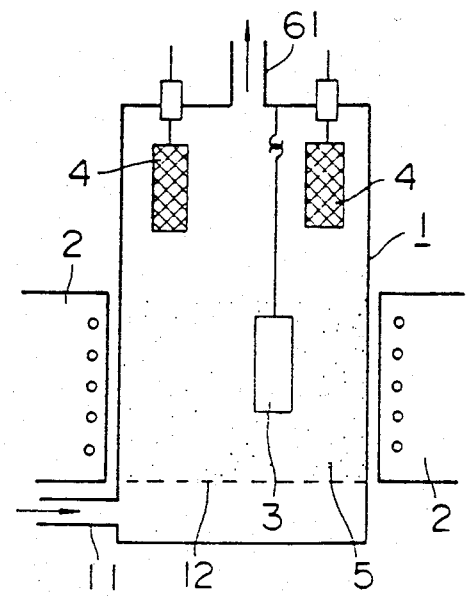
FIG. 10 is a vertical sectional view of still another apparatus embodying this invention.

If any of the furnaces as hereinabove described is used for the preliminary carburizing or nitriding treatment or the heat treatment for carbon diffusion, however, it is necessary to remove the vessel or vessels for the treating agent from the furnace. This inconvenience can be overcome if the vessel or vessels are vertically movable in the furnace, as shown in FIG. 10. When the furnace is used for the carburizing or nitriding treatment or the carbon diffusion treatment, the vessels 4 are raised, and when it is used for the surface treatment according to this invention, they are lowered into the fluidized refractory powder 5. The operation of the apparatus shown in FIG. 10 can be changed quickly between the carburizing or other treatment and the surface treatment according to this invention only if the vessels are vertically moved and the gas which is introduced is changed.

This invention prevents the powder of the treating agent from adhering to the surface of the material to be treated, since the treating agent is held in the vessel or vessels and does not contact the material to be treated. Therefore, it ensures the formation of a carbide or nitride surface layer having a mirror surface on the material to be treated.

As the powder of the treating agent is isolated from the refractory powder forming the fluidized bed, it is sufficient to change only the treating agent if it has decreased its power of forming a carbide or nitride layer. The treating agent can be changed easily and quickly without calling for the change of the refractory powder.

The invention will now be described more specifically with reference to several examples thereof.

EXAMPLE 1

The treatment for forming a carbide layer was carried out by using the fluidized bed furnace hereinbefore described with reference to FIGS. 1 and 2. The furnace body 1 was of a cylindrical structure of the heat-resistant steel construction having an inside diameter of 6 cm and a height of 80 cm. The furnace body 1 was provided with the gas inlet 11 for supplying the fluidizing gas. The gas distributor 12 was provided in the main furnace body 1 immediately above the gas inlet 11 for partitioning the furnace body 1 into two parts. The gas distributor 12 was a plate having a multiplicity of apertures 121 through which the fluidizing gas could be distributed. The cover 6 having a gas outlet 61 was provided at the top of the furnace. The cover 6 is removable from the furnace body 1. The hook 62 for suspending the material 3 to be treated and the vessels 4 was provided on the inner surface of the cover 6. The heater 2 was provided around the furnace body 1. The vessels 4 for holding the treating agent and the material 3 to be treated were disposed in the furnace body 1.

Two kilograms of alumina ($Al_2O_3$) powder having a particle size of 80 to 100 mesh were placed on the gas distributor 12. Argon gas was used as the fluidizing gas. It was introduced into the furnace body 1 through its gas inlet 11 to form a fluidized bed of the alumina powder. The gas had a pressure of 1.5 kg/$cm^2$ at the gas inlet 11 and a flow rate of 50 cm/min. in the furnace. The fluidized bed was heated by the heater 2 to a temperature of 1000° C.

Each of the four cylindrical vessels 4 had a diameter of 1.5 cm and a length of 20 cm. The sidewall of each vessel facing the material to be treated was formed from a net of stainless steel having an opening size of 350 mesh. Each vessel was filled with 200 g of a treating agent. The treating agent was a powder containing 80% by weight of ferrovanadium powder having a particle size of 100 to 200 mesh and 2% by weight of ammonium chloride powder having a particle size of 80 to 200 mesh. The balance of the agent consisted of alumina powder having a particle size of 80 to 100 mesh.

The cover 6 was opened and the material 3 to be treated was suspended from one of the hooks 62 by a stainless steel wire 31 in such a way that it might be positioned substantially in the center of the furnace body 1 when the cover 6 was closed. The material 3 to be treated was a bar of carbon tool steel (AISI W1) having a diameter of 1 cm and a length of 5 cm. Each vessel 4 was also suspended from a hook 62 by a stainless steel wire 31. The vessels 4 were equally spaced apart from one another in a circular array surrounding the material 3 to be treated. Each vessel 4 had a distance of 0.5 cm from the material 3 to be treated. The material 3 to be treated was so positioned that both its upper and lower ends were substantially the same distance from the upper and lower ends, respectively, of the vessels 4.

After the cover 6 had been closed, the furnace was held at a temperature of 1000° C. for two hours. Then, the material 3 was removed from the furnace and was rapidly quenched in oil. A vanadium carbide layer having a thickness of about five microns was found to have been formed on the surface of the material 3. The layer had a smooth surface which was free from any particle adhering thereto.

EXAMPLE 2

The apparatus of FIG. 4 was used. Two kilograms of alumina powder having a particle size of 80 to 100 mesh were placed on the gas distributor 12. The vessel 4 was a double-cylindrical structure having an outside diameter of 4.5 cm, an inside diameter of 3.0 cm and a length of 15 cm. Its inner wall was formed from a net of stainless steel. The vessel 4 was filled with 800 g of a treating agent. The treating agent was a powder containing 70% by weight of ferrotitanium powder having a particle size of 100 to 200 mesh and 2.5% by weight of titanium fluoride powder having a particle size of 80 to 200 mesh. The balance of the agent consisted of alumina powder having a particle size of 80 to 100 mesh. The vessel 4 was placed in the furnace and the material 3 to be treated was positioned in the center of the cylindrical space surrounded by the vessel 4. The material 3 to be treated was a bar of alloy tool steel (AISI D2) having a diameter of 1 cm and a length of 5 cm. Nitrogen was used as the fluidizing gas. It had a pressure of 1.5 kg/cm$^2$ at the gas inlet 11 and a flow rate of 100 cm/min in the furnace. In any other respect, the method of EXAMPLE 1 was repeated. A layer of titanium carbonitride Ti(NC) having a thickness of two or three microns was found to have been formed on the surface of the material 3. The layer had a smooth surface which was free from any particles adhering thereto.

EXAMPLE 3

Figure 9:
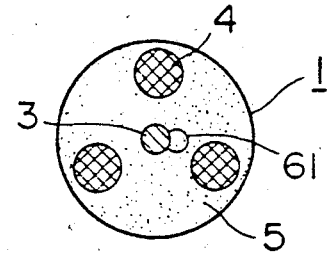
FIG. 9 is a horizontal sectional view of the furnace used in EXAMPLE 3.

The apparatus which was used in EXAMPLE 3 was substantially identical to the apparatus shown in FIGS. 1 and 2, but included three vessels 4, instead of four, as shown in FIG. 9. Each of the vessels 4 and the material 3 to be treated had a distance of 1 cm from the gas distributor 12. Each vessel 4 had a diameter of 2 cm and a length of 5 cm. It had a top wall formed from a net of stainless steel.

Each vessel 4 was filled with 233 g of a treating agent. The treating agent was a powder containing 60% by weight of ferrovanadium powder having a particle size of 100 to 200 mesh and 5% by weight of ammonium chloride powder having a particle size of 80 to 200 mesh. The balance of the agent consisted of alumina powder having a particle size of 80 to 100 mesh. The vessels 4 and the material 3 to be treated were positioned in the furnace 1 as hereinabove described and as shown in FIG. 9. The material 3 to be treated was a bar of alloy tool steel (AISI D2) having a diameter of 1 cm and a length of 5 cm. Argon gas was used as the fluidizing gas. It had a pressure of 1.5 kg/cm$^2$ at the gas inlet and a flow rate of 100 cm/min. in the furnace. Otherwise the method of EXAMPLE 1 was repeated. A vanadium carbide layer having a thickness of three or four microns was found to have been formed on the surface of the material 3. The layer had a smooth surface which was free from any particles adhering thereto.

EXAMPLE 4

The apparatus of FIG. 1 was used for both the preliminary carburizing treatment of the material to be treated and the subsequent treatment thereof for forming a carbide layer on its surface. Two kilograms of alumina powder having a particle size of 80 to 100 mesh were placed in the furnace. The fluidizing gas, which was argon gas, was introduced into the furnace to fluidize the alumina powder. The furnace was heated to 950° C. and the material to be treated was placed in the furnace. It was a bar of pure iron having a diameter of 1 cm and a length of 5 cm. After the furnace had been closed, the supply of the fluidizing gas was discontinued and a carburizing gas was introduced into the furnace. The carburizing gas was a mixture of propane and air having a ratio of 1:4 and was introduced at a flow rate of 100 cm/min. The furnace was held at 950° C. for an hour, whereby the material to be treated was carburized.

The supply of the carburizing gas was discontinued and argon gas was introduced at a flow rate of 100 cm/min. to maintain a fluidized bed of the alumina powder. The method of EXAMPLE 1 was repeated for the subsequent treatment, except that the furnace was held at a temperature of 950° C. for two hours. As a result, a vanadium carbide layer having a thickness of three or four microns was formed on the surface of the material to be treated. The layer had a smooth surface which was free from any particles adhering thereto.

What is claimed is:

1. A method of forming a carbide or nitride layer on the surface of material to be treated in a fluidized bed furnace, said method comprising the steps of:
    disposing a refractory powder, at least one porous vessel filled with a treating agent, and said material in said furnace in a manner so that said material is spaced apart from said vessel, said treating agent being a powder composed of
    (a) powder of at least one carbide or nitride forming metal or alloy and
    (b) powder of at least one compound selected from the group consisting of chlorides, fluorides, bromides, iodides and borofluorides of alkali and alkaline earth metals and/or at least one of an ammonium halide and a metal halide; and
    introducing a fluidizing gas into said furnace under heat to fluidize said refractory powder, said steps being reversible in order.

2. A method as set forth in claim 1, wherein said treating agent contains 0.5 to 20% by weight of said powder (b).

3. A method as set forth in claim 1, wherein said refractory powder is composed of at least one of alumina, silicon oxide, titanium oxide and zirconia.

4. A method as set forth in claim 1, wherein said fluidizing gas has a flow rate of 50 to 700 cm/min. in said furnace.

5. A method as set forth in claim 1, wherein said furnace is heated to a temperature of 400° C. to 1200° C.

6. A method as set forth in claim 1, further comprising the step of first nitriding said material to be treated, wherein said furnace is heated to a temperature of 400° C. to 1200° C.

7. A surface treating apparatus comprising:
    a fluidized bed furnace having an inlet for a fluidizing gas and a gas outlet;

a gas distributor provided in said furnace adjacent to said inlet;

at least one porous vessel, provided between the gas distributor and the gas outlet, for holding a treating agent therein, and means for holding material to be treated in said furnace in a spaced-apart relation from each porous vessel.

8. An apparatus as set forth in claim 7, wherein said vessel is disposed closer to said inlet than said material to be treated.

9. An apparatus as set forth in claim 7, wherein the height of said vessel is the same as or larger than that of said material to be treated.

10. An apparatus as set forth in claim 9, wherein said vessel and said material to be treated have a total cross-sectional area which is at most one-third of the cross-sectional area of said fluidized bed furnace.

* * * * *